(12) United States Patent
Patterson

(10) Patent No.: US 6,970,124 B1
(45) Date of Patent: Nov. 29, 2005

(54) INHERENT-OFFSET COMPARATOR AND CONVERTER SYSTEMS

(75) Inventor: Gregory Wayne Patterson, Greensboro, NC (US)

(73) Assignee: Analog Devices, Inc., Norwood, MA (US)

(*) Notice: Subject to any disclaimer, the term of this patent is extended or adjusted under 35 U.S.C. 154(b) by 64 days.

(21) Appl. No.: 11/056,596

(22) Filed: Feb. 11, 2005

(51) Int. Cl.[7] ............................................... H03M 1/12
(52) U.S. Cl. ..................................... 341/155; 341/161
(58) Field of Search ........................ 341/161, 155, 341/156, 159, 172; 330/252, 253, 258, 259, 330/254, 261; 375/286, 287, 288, 289, 290, 375/291, 292, 293

(56) References Cited

U.S. PATENT DOCUMENTS

| | | | | |
|---|---|---|---|---|
| 5,043,599 | A | | 8/1991 | Zitta ............................ 307/355 |
| 5,517,134 | A | * | 5/1996 | Yaklin .......................... 327/65 |
| 5,563,598 | A | * | 10/1996 | Hickling ..................... 341/155 |
| 6,348,882 | B1 | * | 2/2002 | Ciccone et al. .............. 341/56 |
| 6,388,521 | B1 | * | 5/2002 | Henry .......................... 330/258 |
| 6,448,821 | B1 | | 9/2002 | Sakurai ........................ 327/56 |
| 6,563,374 | B1 | * | 5/2003 | Jaussi et al. ................. 327/562 |
| 6,608,582 | B2 | * | 8/2003 | Casper et al. ............... 341/155 |
| 6,798,293 | B2 | * | 9/2004 | Casper et al. ............... 330/258 |
| 6,801,059 | B2 | * | 10/2004 | Lee ............................... 327/65 |

OTHER PUBLICATIONS

Sackinger, Eduard, et al., "A Versatile Building Block: the CMOS Differential Difference Amplifier", IEEE Journal of Solid-State Circuits, vol. SC-22, No. 2, Apr. 1987, pp. 287-294.

Cho, Thomas, et al., "A 10b, 20Msample/s 35mW Pipeline A/D Converter", IEEE Journal of Solid-State Circuits, vol. 30, No. 3, Mar. 1995, pp. 166-172.

* cited by examiner

*Primary Examiner*—Brian Young
(74) *Attorney, Agent, or Firm*—Koppel, Jacobs, Patrick & Heybl

(57) ABSTRACT

Comparator systems are provided that include first and second differential pairs of transistors with inherent offsets that are a function of their tail currents. Some system embodiments configure the pairs to have substantially-equal, nonzero inherent offset voltages and other embodiments configure them to have substantially-zero inherent offset voltages. The systems further include a feedback network arranged to provide a second tail current to the second differential pair that substantially nulls the second output signal of this differential pair when it is driven by a reference signal. The feedback network generates an identical first tail current for the first differential pair which will now accurately compare an input signal to the reference signal.

22 Claims, 9 Drawing Sheets

INHERENT-OFFSET COMPARATOR AND CONVERTER SYSTEMS

BACKGROUND OF THE INVENTION

1. Field of the Invention

The present invention relates generally to signal comparators.

2. Description of the Related Art

Comparators compare the magnitude of two signals and produce an output that indicates which is greater. This function is an important part of signal conditioning systems. In most analog-to-digital converters, for example, comparison is necessary to initiate the process of quantizing an unknown analog signal.

In a typical comparator process, a differential analog input signal is compared to a differential reference signal. One comparator structure directed to this purpose is the switched-capacitor comparator that presents capacitors to sample a voltage from the input signal in one operational phase and to sample a voltage from the reference signal in another phase. The difference between the voltages is stored on the capacitors and a differential amplifier compares the sampled difference to zero and its output indicates the comparison.

Although switched-capacitor comparators are accurate and are relatively insensitive to common-mode levels, they tend to reduce comparison speed because they draw currents from associated circuits. This current flow tends to inject charges into the associated circuits which disturbs them and increases settling times. In addition, the switched capacitors load the associated circuits and add complexity because they require additional timing circuits to control their operational phases.

A simpler comparator structure uses two differential amplifiers to form the difference between a differential input signal and a differential reference signal. Sometimes called a 4-input comparator, this structure exhibits improved speed because it does not require the sampling processes of the switched-capacitor comparator. Unfortunately, differences between the common-mode levels of the input and reference signals alter the amplifier gains so that 4-input comparators are sensitive to common-mode differences.

Differential amplifiers have been fabricated with device mismatches that produce an inherent offset which essentially equals the reference signal. This structure can form a high speed comparator that is relatively insensitive to common-mode differences. However, the offset is quite sensitive to several effects (e.g., temperature, fabrication processes and power supply variations) and this sensitivity has limited the usefulness of these comparators.

BRIEF SUMMARY OF THE INVENTION

The present invention is directed to comparator systems that have high speed and good rejection of common-mode differences and are relatively insensitive to variations in operation and fabrication conditions. The novel features of the invention are set forth with particularity in the appended claims. The invention will be best understood from the following description when read in conjunction with the accompanying drawings.

DETAILED DESCRIPTION OF THE INVENTION

Comparator systems are shown in FIGS. 1–8 which configure first and second differential pairs of transistors to respectively provide first and second output signals in respective response to a first input signal and a reference signal and which add feedback networks arranged to provide a second tail current to the second differential pair that substantially nulls the second output signal of this differential pair when it is driven by a reference signal. The feedback network provides an identical first tail current to the first differential pair which will now accurately compare an input signal to the reference signal.

Figure 1:
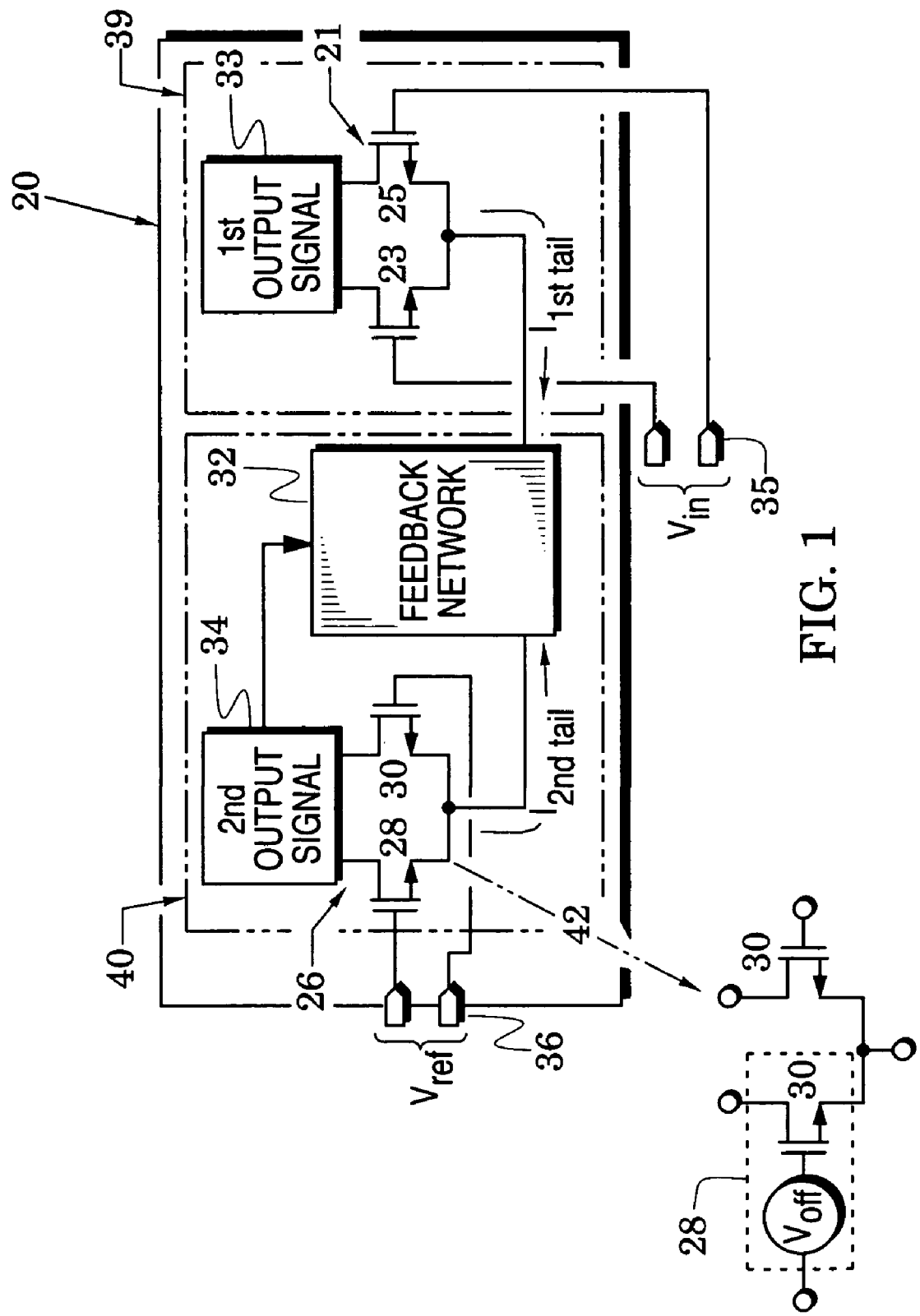
FIG. 1 is a diagram of a comparator system embodiment of the present invention.

In particular, FIG. 1 illustrates a comparator system 20 which includes a first differential pair 21 of transistors 23 and 25, a second differential pair 26 of transistors 28 and 30 and a feedback network 32. As shown, the first and second differential pairs respectively provide first and second output signals 33 and 34 in respective response to an input signal $V_{in}$ and a reference signal $V_{ref}$ at input ports 35 and 36. The first differential pair 21 forms a comparator 39 and the second differential pair 26 and its associated feedback network 32 form a bias generator 40 which insures that the comparator 39 compares the input signal $V_{in}$ to the reference signal $V_{ref}$ over all operation and fabrication conditions.

The first and second differential pairs are configured to have inherent offset voltages. For example, the transistor 30 of the second differential pair 26 is configured to generate a drain current of $$I_{30} = \frac{1}{2}\mu C_{ox}\frac{W}{L}(V_{gs30} - V_T)^2 \quad (1)$$

and the transistor 28 of the second differential pair can be configured to generate a drain current of $$I_{28} = N\frac{1}{2}\mu C_{ox}\frac{W}{L}(V_{gs28} - V_T)^2 \quad (2)$$

wherein N is a selected number, $\mu$ and $C_{ox}$ are average electron mobility and gate oxide capacitance per unit area, $V_{gs}$ and $V_T$ are each transistor's gate-to-source voltage and threshold voltage and W and L are gate width and length.

The offset voltage of a differential pair is defined as the input voltage that must be applied to force its differential output signal to zero. If the drain currents of the second differential pair 26 are equal (i.e., each has a magnitude of one half of a second tail current $I_{2nd\ tail}$), then equations (1) and (2) lead to $$N(V_{gs_{28}} - V_T)^2 = (V_{gs_{30}} - V_T)^2 \quad (3)$$

so that $V_{gs_{28}}$ can be expressed as $$V_{gs_{28}} = \frac{V_{gs_{30}}}{\sqrt{N}} + V_T\left(1 - \frac{1}{\sqrt{N}}\right). \quad (4)$$

For significant values of N (e.g., 4), $V_{gs_{28}}$ is thus reduced from $V_{gs_{30}}$ so that the second differential pair 26 has an offset voltage of $$V_{off} = V_{gs_{30}} - V_{gs_{28}} \quad (5)$$

As indicated by the equivalent arrow 42, the transistor 28 is thus equivalent to the series combination of an offset voltage $V_{off}$ and a copy of the transistor 30. That is, the second differential pair 26 is equivalent to a differential pair of transistors 30 wherein one of the transistors 30 is accompanied by an offset voltage $V_{off}$. Because the second differential pair is thus configured with an inherent offset voltage $V_{off}$, its drain currents will be equal only when $V_{ref}$ equals the offset voltage $V_{off}$.

Unfortunately, equations (1) and (2) vary over operation and fabrication conditions (e.g., temperature and fabrication process) so that the offset voltage $V_{off}$ also varies over these conditions. The comparator system 20, however, provides the feedback network 32 which alters the second tail current $I_{2nd}$ tail such that it is sufficient to substantially null (i.e. set to zero) the second output signal 34 (which may be differential currents or differential voltages).

That is, the feedback network 32 monitors the second output signal 34 and adjusts the second tail current $I_{2nd}$ tail to substantially null the second output signal. Accordingly, with the reference signal $V_{ref}$ applied to the input port 36, the second output signal 34 is substantially nulled over all operation and fabrication conditions.

The first differential pair 21 is fabricated to be a replica of the second differential pair 26 and the feedback network 32 provides a first tail current $I_{1st}$ tail that substantially equals the second tail current $I_{2nd}$ tail. Accordingly, the first output signal will be substantially nulled over all operation and fabrication conditions when the input signal $V_{in}$ equals the reference signal $V_{ref}$.

When the input signal $V_{in}$ differs from the reference signal $V_{ref}$ (i.e, becomes greater than or less than), the first output signal 33 will correspondingly differ from its null condition. Thus the comparator 39 will accurately compare the input signal $V_{in}$ to the reference signal $V_{ref}$ over all operation and fabrication conditions and the first output signal 33 will be a faithful indication of that comparison.

Figure 2:
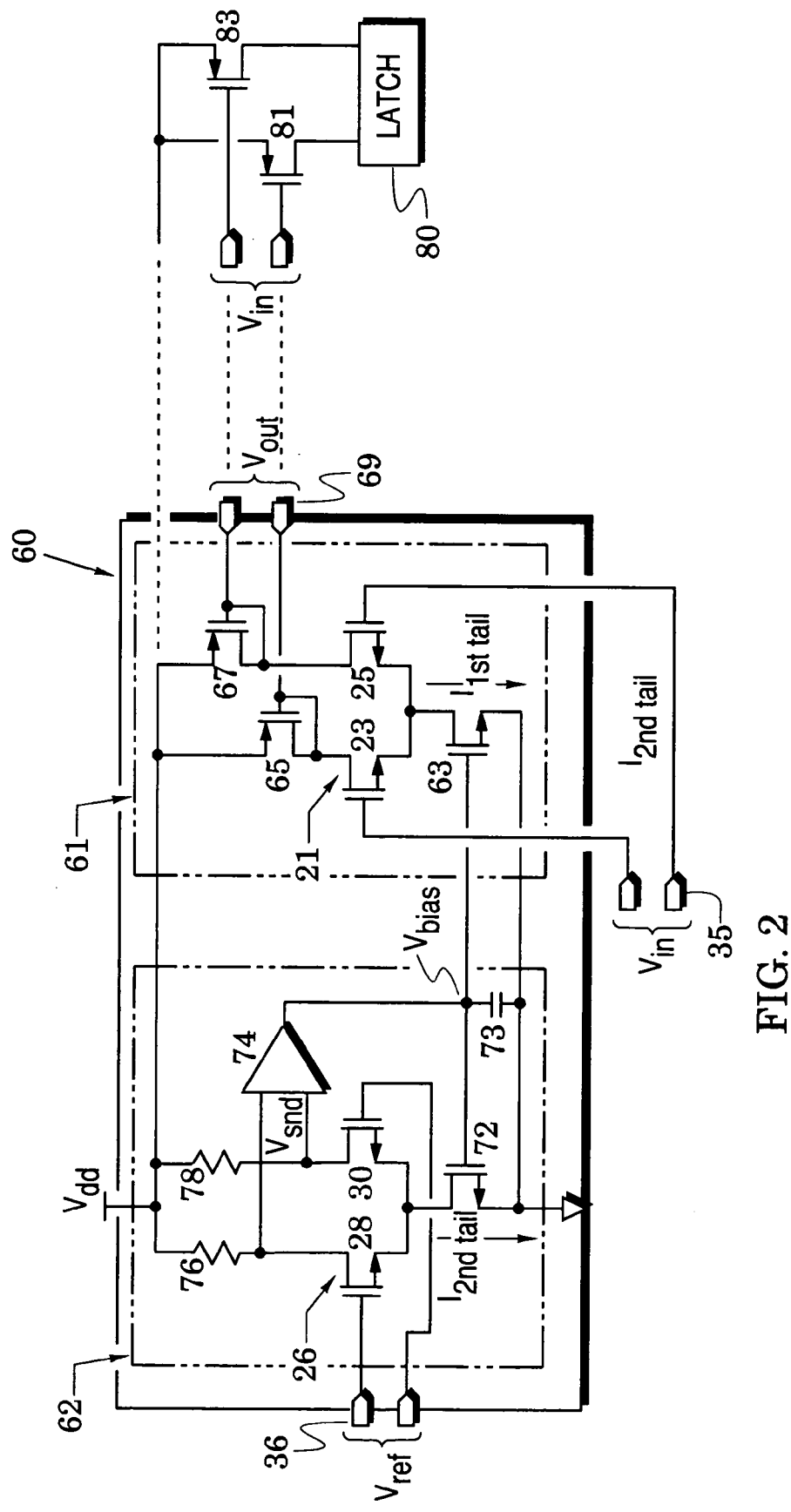
FIGS. 2 and 3 are schematics of additional embodiments of the system of FIG. 1.

FIG. 2 illustrates another comparator system embodiment 60 which includes elements of FIG. 1 with like elements indicated by like reference numbers. The comparator 39 of FIG. 1 is altered to a comparator 61 in which the feedback network (32 in FIG. 1) drives a transistor 63 that generates the first tail current (of FIG. 1) in response to a bias voltage $V_{bias}$. In the comparator 61, the first output signal is a differential output signal $V_{out}$ which is supplied at an output port 69. This output signal embodiment is realized by inserting loads for the first differential pair 21 in the form of diode-coupled transistors 65 and 67 so that differential drain currents (another output signal embodiment) of the transistors 23 and 25 pass through these loads and generate the differential output voltage $V_{out}$.

The bias generator 40 of FIG. 1 is altered to a bias generator 62 in which the feedback network (32 in FIG. 1) includes a transistor 72 that provides the second tail current (of FIG. 1) in response to the bias voltage $V_{bias}$. The feedback network further includes a differential amplifier 74 which generates the bias voltage $V_{bias}$ in response to a second output signal in the form of a differential second voltage $V_{snd}$.

This output signal embodiment is realized by inserting loads for the second differential pair 26. Although these loads may be diode-coupled transistors in one output signal embodiment, they are resistors 76 and 78 in the embodiment shown in FIG. 2. Differential drain currents (another output signal embodiment) of the transistors 28 and 30 pass through these loads and generate the differential second voltage $V_{snd}$. Feedback embodiments of the invention preferably include a shunt capacitance (e.g., the capacitor 73 which, for simplicity of illustration, is not shown in other embodiments)) on the feedback path to enhance loop stability and also reduce noise.

In operation of the system 60, the differential amplifier 74 adjusts the second tail current $I_{2nd}$ tail of the transistor 72 so that the differential second voltage $V_{snd}$ is substantially nulled. The comparator 61 will now accurately compare the input signal $V_{in}$ to the reference signal $V_{ref}$ over all operation and fabrication conditions and the output signal $V_{out}$ at the output port 69 will be a faithful indication of that comparison.

As shown in FIG. 2, the system 60 may be augmented with a latch 80 and transistors 81 and 83 which form respective current mirrors with transistors 65 and 67. In this embodiment, the first differential currents of the first differential pair 21 are mirrored to the latch 80 and the condition of the latch indicates the comparison of the input signal $V_{in}$ to the reference signal $V_{ref}$.

Figure 3:
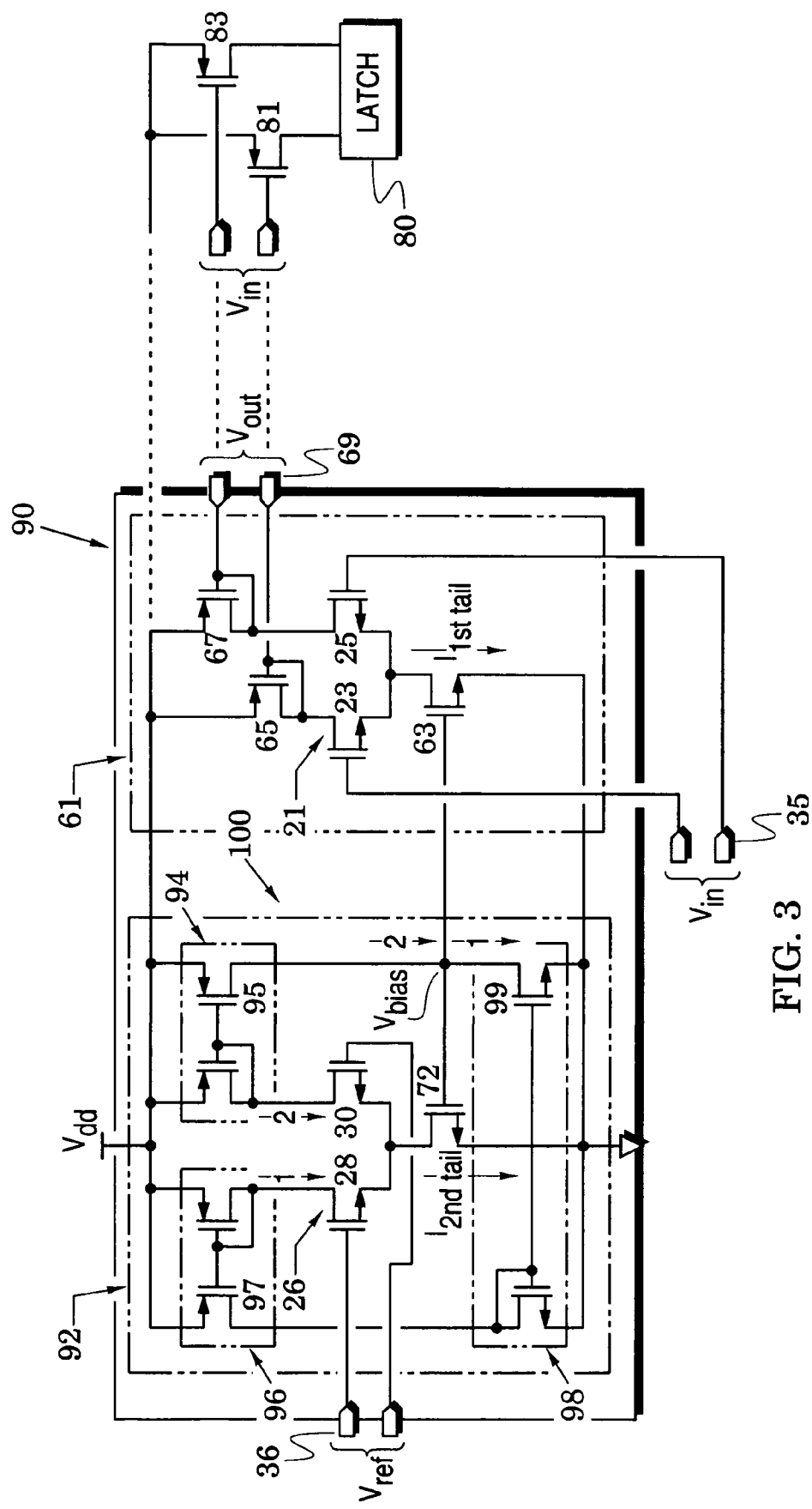

FIG. 3 illustrates another comparator system embodiment 90 which includes elements of FIG. 2 with like elements indicated by like reference numbers. In the system 90, the differential amplifier 74 and the loads 76 and 78 are replaced by feedback elements in the form of first, second and third current mirrors 94, 96 and 98 to form a different bias generator 92.

The first current mirror 94 has a diode-coupled transistor connected to receive a second current from transistor 30 of the second differential pair 26. A mirror transistor 95 is gate-coupled to this diode-coupled transistor and mirrors the second current to the terminal marked $V_{bias}$.

The second current mirror 96 has a diode-coupled transistor connected to receive a first current from transistor 28 of the second differential pair 26. A mirror transistor 97 is gate-coupled to this diode-coupled transistor and mirrors the second current to the third current mirror 98. The third current mirror also has a diode-coupled transistor connected to receive the mirror current from the mirror transistor 97. A mirror transistor 99 is gate-coupled to this diode-coupled transistor and mirrors the received current to the terminal marked $V_{bias}$.

The mirror transistors 95 and 99 are thus arranged as a complimentary common-source output stage 100 which respectively sources and sinks first and second currents to and from the terminal marked $V_{bias}$. The first and second currents are identified by numbers "1" and "2" at the $V_{bias}$ terminal and equivalent first and second currents are shown at the output of the second differential pair 26 where they form the second output signal (34 in FIG. 1).

When the first and second currents are equal at the second differential pair 26, the output stage 100 does not alter $V_{bias}$. When the first and second currents differ, their difference is mirrored by the output stage 100 to alter $V_{bias}$ sufficiently to bring the first and second currents back into equality.

Figure 4:
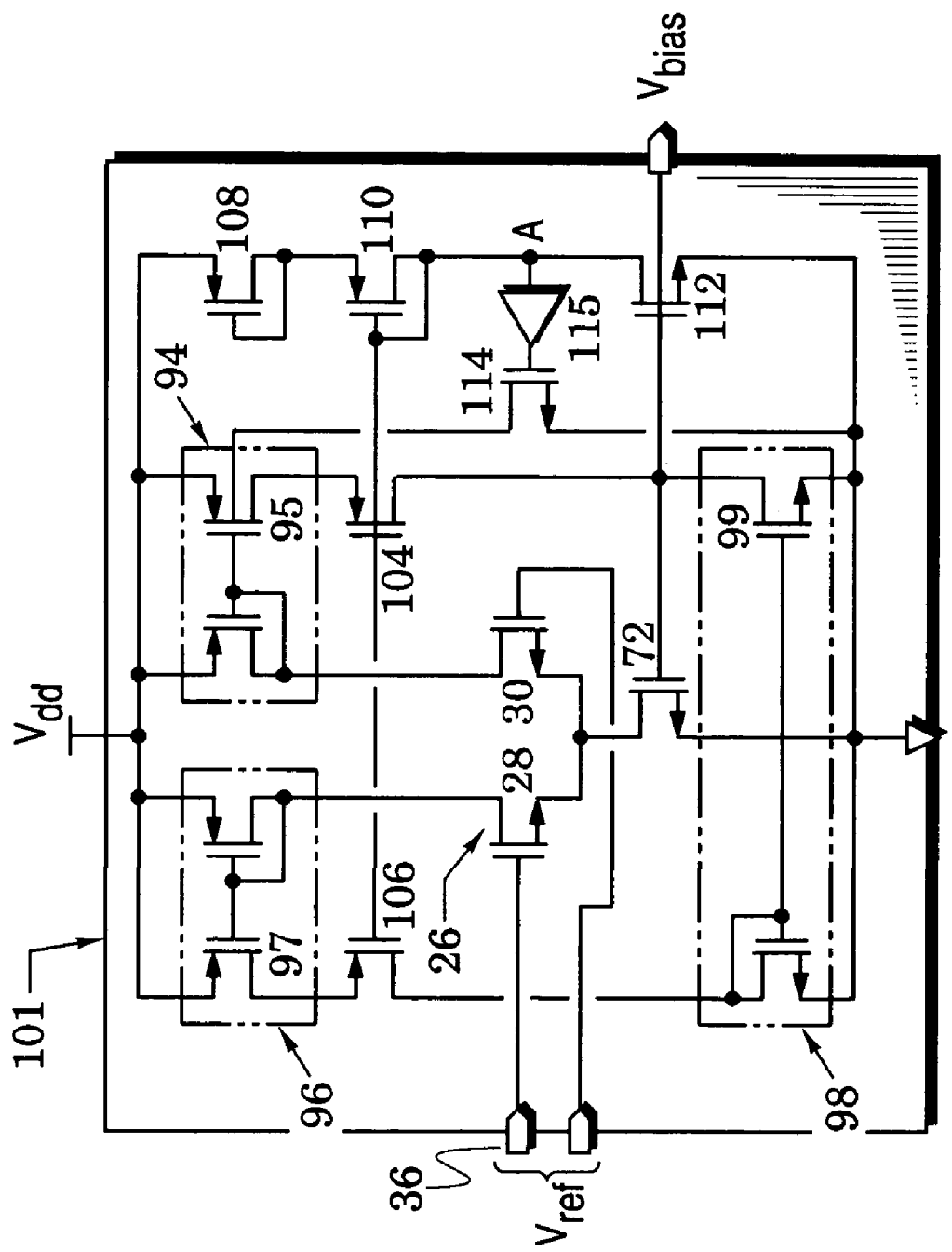
FIG. 4 is a schematic of another embodiment of a bias generator in the system of FIG. 3.
Figure 5:
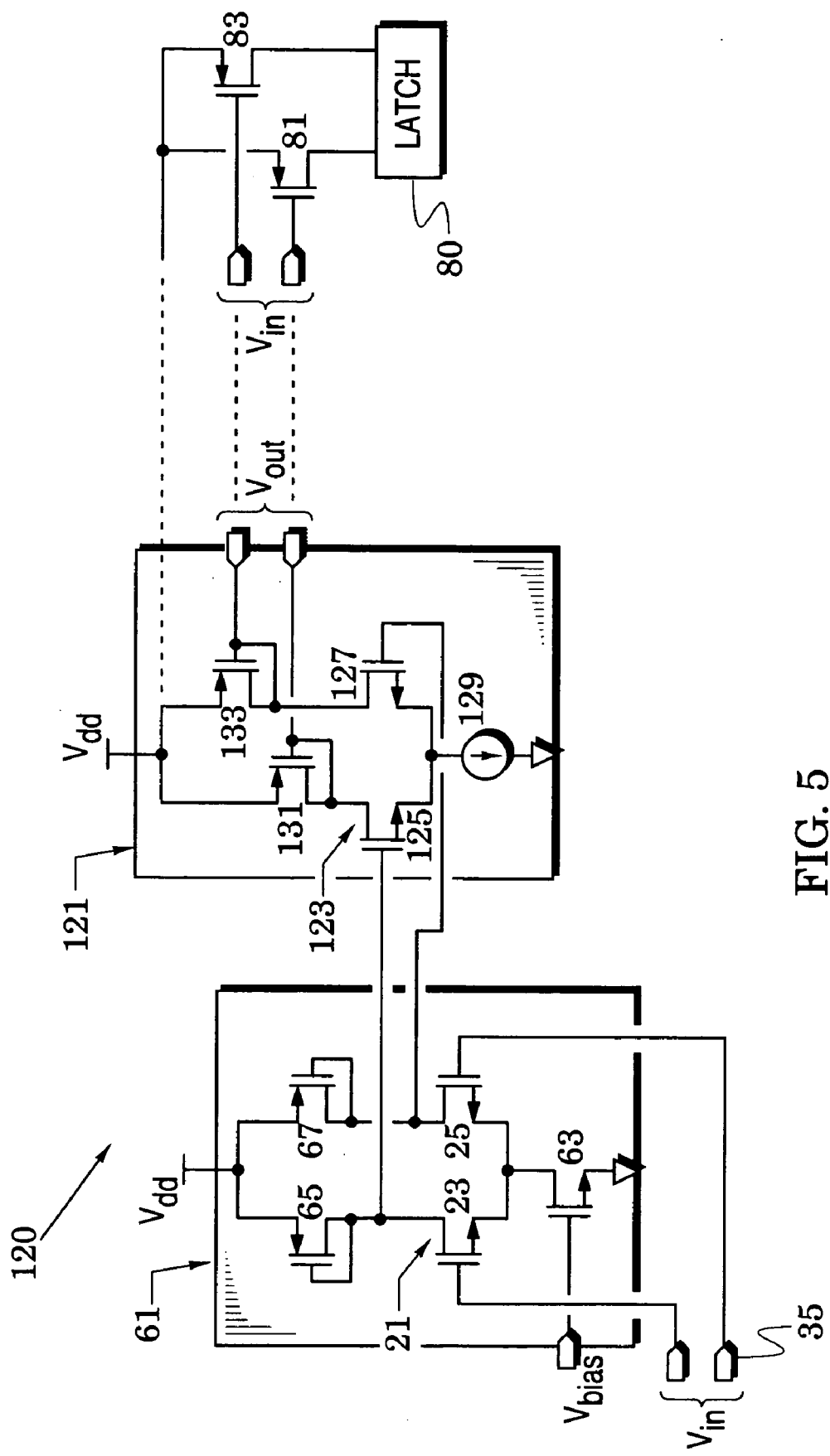
FIG. 5 is a schematic of another embodiment of a comparator in the system of FIG. 3.

In FIG. 4, the bias generator 92 of FIG. 3 is altered to a generator embodiment 101 which adds common-gate transistors 104 and 106, diode-coupled transistors 108 and 110 and an additional common source transistor 112 in a series arrangement with transistors 108 and 110. The common-gate transistors 104 and 106 are respectively arranged in a cascode arrangement with mirror transistors 95 and 97 to thereby significantly increase the output impedance of the current mirrors 94 and 96.

The increased output impedance significantly enhances the accuracy of the feedback network (i.e., enhanced nulling of the output currents of the second differential pair 26). Transistors 108 and 110 are arranged to provide proper gate biasing of the common-gate transistors 104 and 106.

Preferably, a startup transistor 114 is coupled to pull current from the gate node of mirror transistor 95 and a buffer 115 is coupled to drive the startup transistor 114 in response to the node "A" between transistors 110 and 112. This startup arrangement insures that operation of the feedback network is properly initiated when the supply voltage $V_{dd}$ is applied to the generator 101.

For example, it is possible that the gate of transistor 72 settles essentially to ground potential when the supply voltage is applied to the generator 101 so that feedback operation is never initiated. If this occurs, the buffer 114 will apply a high signal which causes startup transistor 114 to pull current through the diode-coupled transistor of the first current mirror 94. This initiates operation of this current mirror which, in turn, initiates current in the tail current transistor 72. Consequently, the second differential pair 26 provides currents to current mirrors 94 and 96 and generator operation proceeds as described above. This operation pulls node A low which turns off the startup transistor 114.

FIG. 2 illustrated the use of current mirrors (respectively comprising transistors 65 and 81 and transistors 67 and 83) for sending the decisions of the comparator 61 to a latch 80. The bias currents of the first differential pair vary over operation and fabrication conditions (e.g., they vary inversely with temperature and drop with reduced speed of the fabrication process), so that the mirrored currents to the latch vary in a similar manner. To insure that these variations never degrade successful operation of the latch 80, the interface 120 of FIG. 5 may be used.

In this interface, the diode-coupled transistors 65 and 67 are used as loads which generate a differential output voltage (another embodiment of the first output signal 33 of FIG. 1) that drives transistors 125 and 127 of a differential pair 123. In response, these transistors steer the current of a stable current source 129 through diode-coupled transistors 131 and 133 which are respectively coupled to form current mirrors with transistors 81 and 83.

The differential pair 123, the current source 129 and diode-coupled transistors 131 and 133 thus form a buffer 121 which is inserted between the comparator 61 and the latch 80. The buffer 121 insures that stable currents drive the latch 80 over all operation and fabrication conditions (it is noted that, unlike the first differential pair 21, the differential pair 123 is configured to not have an inherent offset voltage).

It is important to realize that each bias generator (e.g., generator 62 in FIG. 2) can provide a bias signal $V_{bias}$ for a plurality of comparators (e.g., 61 in FIG. 2) that are configured with the same inherent offset voltage. In this comparator embodiment, each comparator 61 does not require its own bias generator but can share a generator with other comparators 61.

In such a configuration, it is noted that noise picked up on the signal line $V_{bias}$ will alter the comparator thresholds of the first differential pairs (e.g., differential pair 21 in FIG. 2) because the current source (e.g., source 63 in FIG. 2) offers no common-mode rejection. Although this noise is filtered by the capacitor 73, this noise pickup problem can be further reduced by grouping the tail current transistors (e.g., transistor 63 in FIG. 2) near the bias generator and distributing their tail currents to their respective first differential pairs. This configuration will be subsequently explored in the comparator system 180 of FIG. 11.

Equations (1) and (2) showed that the inherent offset voltage of the first and second differential pairs (21 and 26 in FIG. 1) is realized by configuring each pair's transistors such that the drain current of one of them is N times greater than that of the other for the same gate-to-source voltage. Although this can theoretically be obtained with a greater electron mobility, a greater gate oxide capacitance or a smaller gate length, an especially attractive method is by providing one transistor with a greater gate width.

In one embodiment, for example, several transistors can be provided with identical gate dimensions. One can then be used for one of the differential pair transistors and more than one paralleled to form the other of the differential pair transistors. It is noted that the transconductance of the differential pairs will increase if wider gate widths are used for the pair and this enhances the gain of the differential pairs. The tail currents, however, must then be increased to obtain the desired offset and this incurs the cost of increased current demand from the supply voltage $V_{dd}$. For a selected channel width, it is noted that greater values of N will decrease the current demand but incur the penalties of lower transconductance and somewhat degraded matching.

In the comparator system embodiments 20, 60 and 90 of FIGS. 1, 2 and 3, a feedback network was configured to provide a second tail current to the second differential pair 26 sufficient to substantially null the second output signal 34 and to provide a first tail current to the first differential pair 21 that substantially equals the second tail current. In these embodiments, the first and second differential pairs of transistors are configured to have substantially-equal, nonzero inherent offset voltages. The nonzero inherent offset voltages may be realized, for example, by configuring each of the differential pairs to have one transistor with a first channel width and the other of the transistors with a second channel width that differs from the first channel width.

Figure 6:
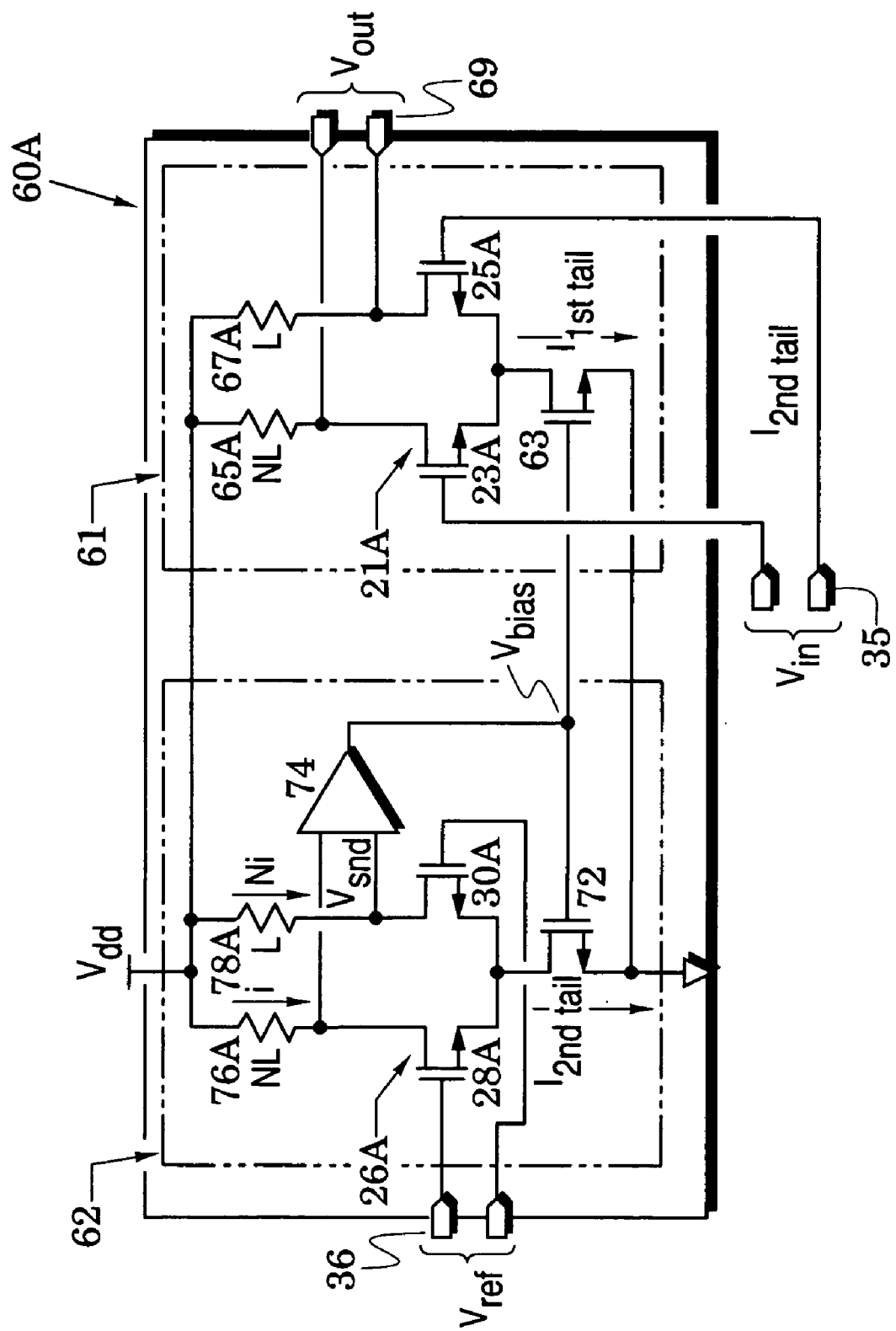
FIGS. 6, 7 and 8 are schematics of additional embodiments of the system of FIG. 1.
Figure 7:
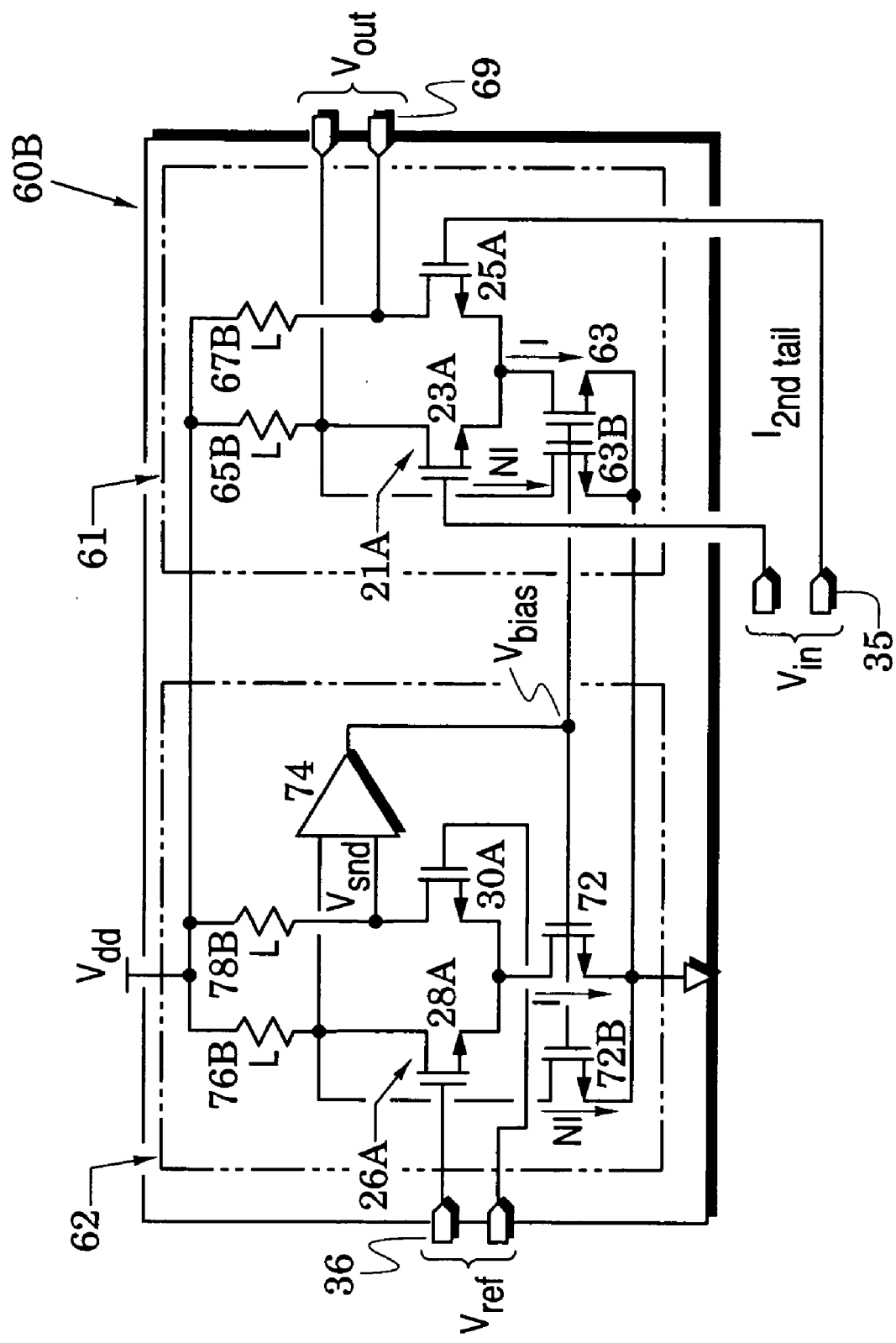
Figure 8:
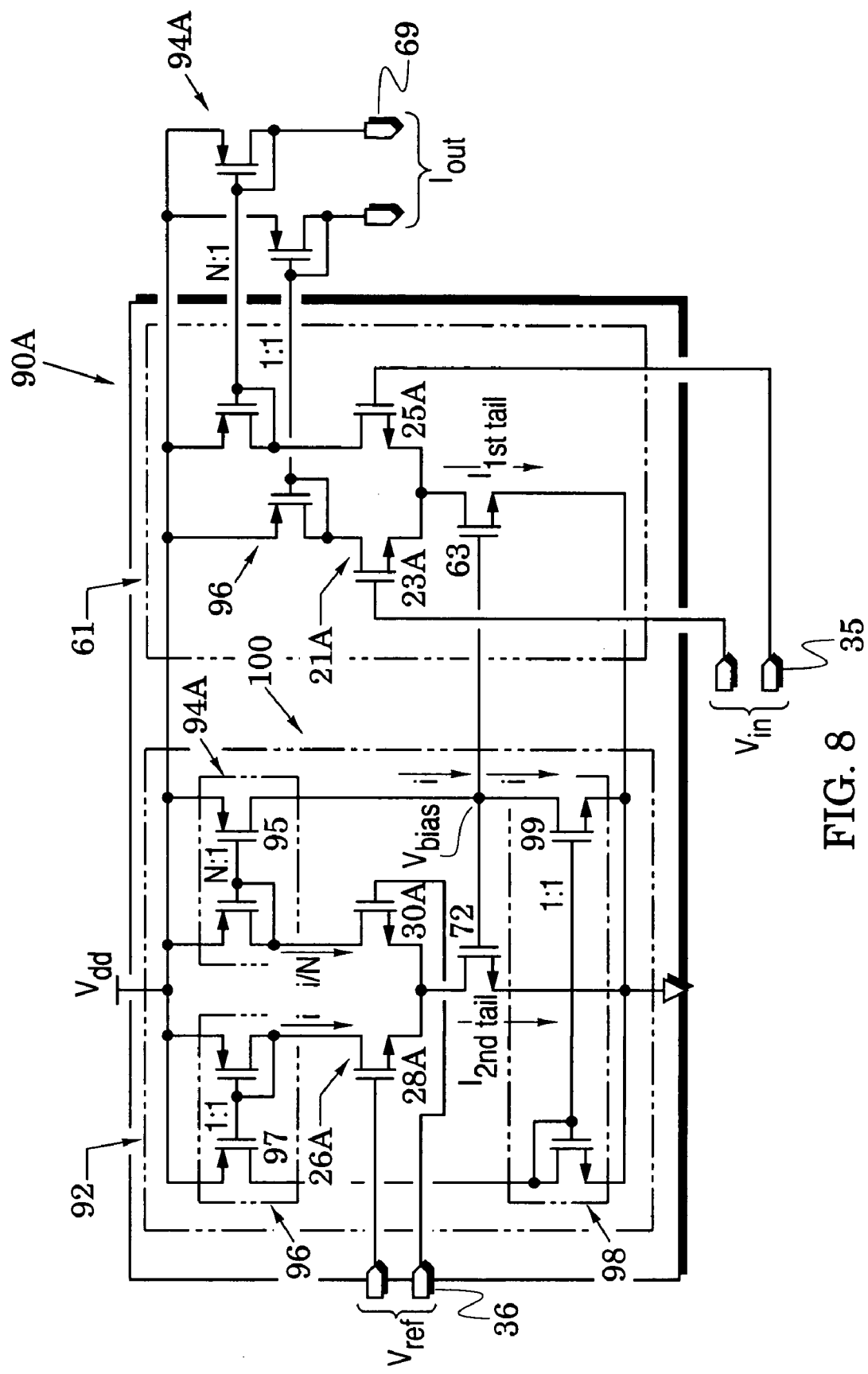

FIGS. 6, 7 and 8 illustrate additional comparator system embodiments 60A, 60B and 90A in which the feedback network is again configured to provide a second tail current to the second differential pair sufficient to substantially null the second output signal and to provide a first tail current to the first differential pair that substantially equals the second tail current. In contrast to the embodiments of FIGS. 1, 2 and 3, however, the first and second differential pairs of transistors of the embodiments 60A, 60B and 90A are configured to have substantially-equal channel widths to thereby generate substantially-zero inherent offset voltages. Other system components are then configured differently to cause the input signal $V_{in}$ at input port 35 to be accurately compared to the reference signal $V_{ref}$ at input port 36.

For example, the comparator 60A of FIG. 6 includes elements of the comparator 60 of FIG. 2 (with like elements indicated by like reference numbers) but replaces the first and second differential pairs 21 and 26 of FIG. 2 with a first differential pair 21A (of transistors 23A and 25A) and a second differential pair 26A (of transistors 28A and 30A) that are configured with substantially-zero inherent offset voltages. The comparator 60A also replaces the loads of the first and second differential pairs with unequal loads that differ by a factor N. In the embodiment shown, the unequal loads for the first differential pair are resistors 65A and 67A (having load values NL and L) and the unequal loads for the second differential pair are resistors 76A and 78A (also having load values NL and L).

In operation, the feedback network constantly alters the bias signal $V_{bias}$ to keep the second output signal (34 in FIG. 1) substantially zero. Accordingly, a current i flows through load 76A and a current Ni flows through load 78A. These different currents correspond to different gate-to-source voltages in transistors 28A and 30A and this difference is substantially the reference signal $V_{ref}$.

The comparator 60B of FIG. 7 includes elements of the comparator 60A of FIG. 6 (with like elements indicated by like reference numbers) but replaces the unequal loads 65A, 67A and 76A, 78A with substantially-equal loads 65B, 67B and 76B, 78B (having load values L and L). The comparator 60B, however, includes current transistors 63B and 72B that receive the bias signal $V_{bias}$ and provide currents to the sources of transistors 23A and 28A. The current sources 63 and 72 are sized to provide currents I and the current sources 63B and 72B are sized to provide currents NI.

In operation of the comparator 60B, equal currents flow through the loads 76B and 78B but, because of the current NI of the current transistor 72B, the currents through transistors 28A and 30A differ. These different currents correspond to different gate-to-source voltages in transistors 28A and 30A and this difference is substantially the reference signal $V_{ref}$.

The comparator 90A of FIG. 8 includes elements of the comparator 90 of FIG. 3 (with like elements indicated by like reference numbers) but replaces the first current mirror 94 with a first current mirror 94A. The first and second current mirrors 94 and 96 of FIG. 3 were equal mirrors but the first and second current mirrors 94A and 96 are unequal current mirrors. In particular, the second and third current mirrors 96 and 98 are 1:1 current mirrors and the first current mirror 94A is an N:1 current mirror. In addition, the comparator 90A has the first and second differential pairs 21A and 26A that were introduced in FIG. 6. The first differential pair 21A is also provided with current mirrors 94A and 96.

In operation of the comparator 90A, feedback will cause the complimentary common-source output stage 100 to deliver substantially-equal currents i to and from the bias terminal (at gates of current transistors 72 and 63). The current ratios of the first and second current mirrors 94A and 96 will then cause different currents i and i/N to flow through transistors 28A and 30A. These different currents correspond to different gate-to-source voltages in transistors 28A and 30A and this difference is substantially the reference voltage reference signal $V_{ref}$.

Figure 9:
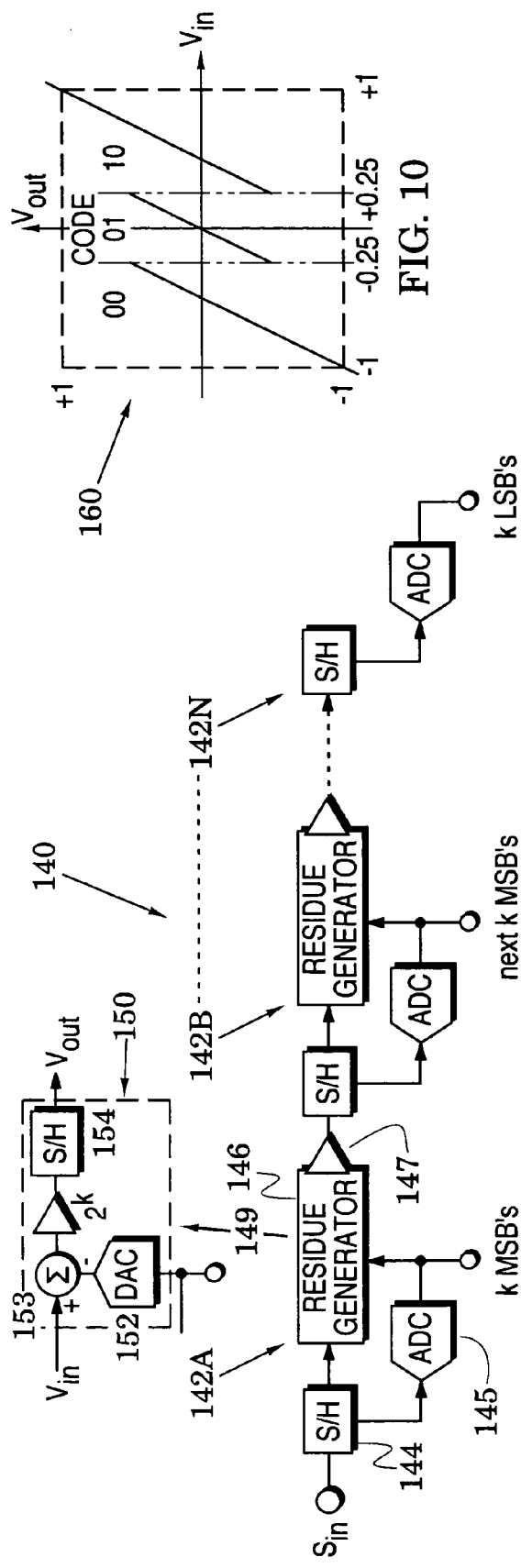
FIG. 9 is a block diagram of a pipelined analog-to-digital converter system embodiment that includes comparator system embodiments of the invention.

Analog-to-digital converters (ADCs) require accurate signal comparators in their conversion processes. FIG. 9, for example, illustrates an ADC system 140 that comprises a plurality of pipelined converter stages 142A, 142B,—142N. In such systems, each converter stage samples an analog signal, provides at least one corresponding digital bit, and passes to a subsequent stage a residue that represents the difference between each sample and an analog signal that corresponds to the provided digital bit (i.e., an estimate of the sample).

As shown in FIG. 9, a typical stage 142A includes a sampler 144 (designated S/H for sample and hold), an ADC 145, a residue generator 146 and an amplifier 147. In operation of the converter stage 142A, the sampler 144 provides samples of an analog input signal Sin at a clocked rate. The ADC 146 converts each sample to k of the most significant bits (MSB's). The residue generator 146 converts the k MSB's to an analog estimate (estimate of the analog sample) and subtracts this analog estimate from the input signal $S_{in}$ to form a residue signal that can be passed to a subsequent converter stage for derivation of further MSB's.

To enhance conversion accuracy, the residue signal is preferably "gained up" in the amplifier 147 so that the analog window presented to the subsequent stage is substantially that of the present stage. Because the final converter stage 142N provides the final least significant bits (LSB's), it does not require the residue generator of preceding stages.

Example arrow 149 indicates that an exemplary residue generator is a multiplying digital-to-analog converter (MDAC) 150 that includes a DAC 152, a summer 153, the amplifier 147 (with gain $2^k$) and another sampler 154. The DAC 152 forms the analog estimate, the summer 153 forms the residue by subtracting the analog estimate from the analog sample, and the amplifier amplifies the residue with gain $2^k$. Finally, the sampler 154 provides analog samples to the subsequent converter stage at the clock rate.

MDAC's have been configured with various structures such as switched-capacitor structures that present a capacitor to receive a charge from a preceding stage in one portion of a sample time span. In a second portion of this time span, the capacitor is switched to transfer its charge into another capacitor that is coupled about a high-gain amplifier. The received and transferred charge forms the "gained-up" residue signal.

Figure 10:
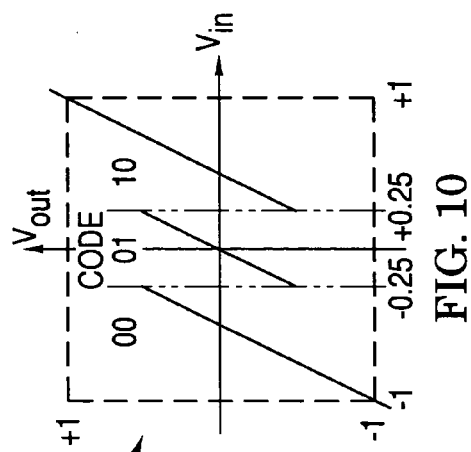
FIG. 10 is a graph of a transfer function for a residue generator in converter stages of FIG. 9.

An exemplary ADC for the converter stage 142A of FIG. 9 is a 1.5 bit ADC and the transfer function of an MDAC for this ADC is shown in the graph 160 of FIG. 10 in which it is assumed that the ADC has a full scale range of 2 volts. The graph 160 thus indicates the input voltage $V_{in}$ and output voltage $V_{out}$ of the MDAC 150. The 1.5 bit ADC has two sections which respectively compare the input signal to −0.25 volts and to +0.25 volts to thereby produce the digital codes 00, 01 and 10 shown in the graph 160. As indicated in the graph, the MDAC includes gain sufficient to produce a full scale output (2 volts) for input signals that span the entire input range (2 volts).

Figure 11:
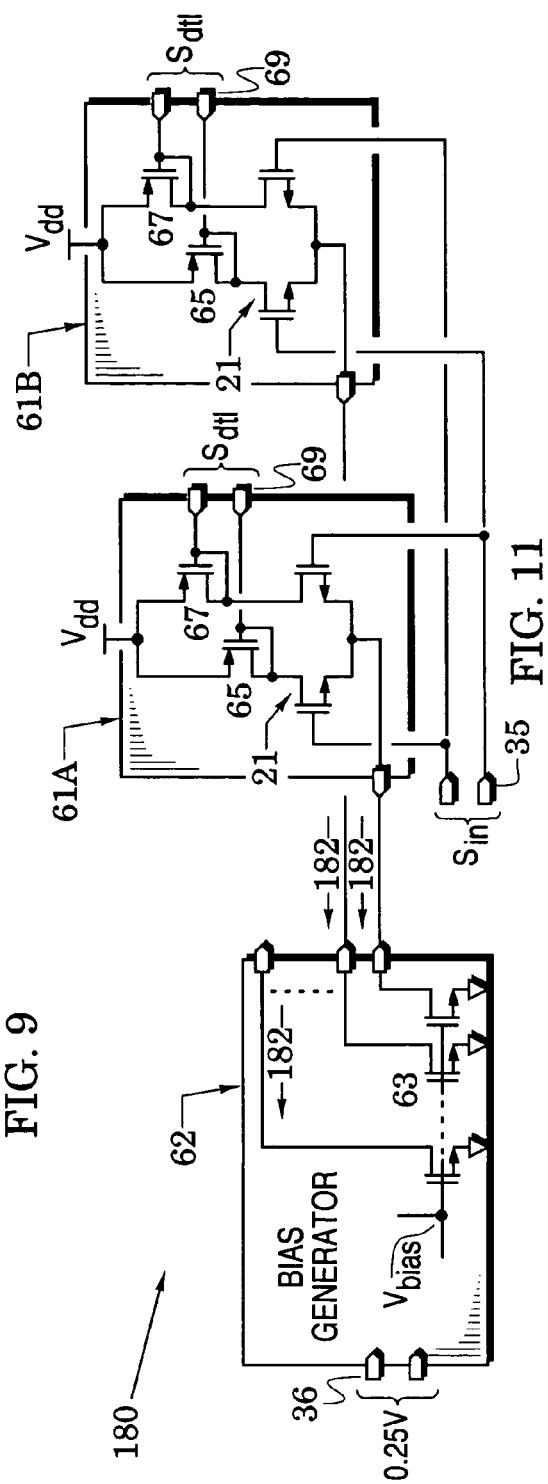
FIG. 11 is schematic of a converter stage for the system of FIG. 9 that is formed with comparator system embodiments of the invention.

FIG. 11 illustrates a comparator system 180 that corresponds to the MDAC transfer function 160 of FIG. 10 and can thus serve as the ADC 145 in FIG. 9. This system includes the bias generator 62 and two of the comparators (61A and 61B) of FIG. 2. The bias generator provides a bias signal $V_{bias}$ (in a manner shown in FIG. 2) and is supplemented with transistors 63 that each receive the bias signal and mirror the second tail current of FIG. 2 to a respective first tail current 182.

Essentially, the current transistors 63 of FIG. 2 have been moved from the comparators 61A and 61B into the bias generator 62. Accordingly, tail currents 182 travel across circuit paths between the bias generator and the comparators rather than having the bias signal $V_{bias}$ conducted over these circuit paths. This enhances the noise rejection of the system 180 because currents are relatively insensitive to spurious noise.

To correspond to the comparator levels indicated in FIG. 10, the reference signal $V_{ref}$ of FIG. 2 is set to 0.25V in the bias generator 62 of FIG. 11. The corresponding tail currents 182 will then insure that comparators 61A and 61B have inherent offsets of 0.25V. Accordingly, the input signal $S_{in}$ of FIG. 9 can be applied to the comparator 61A (at port 35) and a corresponding digital signal will be supplied at the comparator output port 69. This conversion operation corresponds to the comparator level +0.25 in FIG. 10.

As shown in FIG. 11, the input signal $S_{in}$ is inverted as it is applied to the comparator 61B so that a corresponding digital signal $S_{dtl}$ will be supplied at this comparator's output port 69 and this conversion operation corresponds to the comparator level −0.25 in FIG. 10. The bias generator 62 is shown to provide other tail currents 182. These can be sent to other comparator pairs that provide 1.5 bit comparisons in subsequent converter stages (e.g., stages 142B–142N in FIG. 9). Thus, one bias generator can provide appropriate tail currents for a plurality of comparators that have the same inherent offset voltage.

High speed converter structure embodiments have been disclosed which reject common-mode differences and that are insensitive to variations in operation and fabrication conditions. Some embodiments include first and second differential pairs of transistors that are configured to have substantially-equal, nonzero inherent offset voltages and other embodiments include first and second differential pairs of transistors that are configured to have substantially-zero inherent offset voltages. Although these embodiments have been illustrated with metal-oxide-semiconductor (MOS) transistors, other embodiments can be formed with other transistor types (e.g., bipolar junction transistors).

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A comparator system, comprising:
   first and second differential pairs of transistors that respectively provide first and second output signals in respective response to a first input signal and a reference signal and that have offset voltages which vary in correspondence to applied tail currents; and
   a feedback network configured to provide:
   a) a second tail current to said second differential pair sufficient to substantially null said second output signal; and
   b) a first tail current to said first differential pair that substantially equals said second tail current;
   said first output signal thereby providing a comparison of said first input signal to said reference signal;
   wherein said first and second differential pairs of transistors are configured to have substantially-equal, nonzero inherent offset voltages and wherein said feedback network includes:
   a differential amplifier that provides a bias signal in response to said second output signal; and
   a current transistor which provides said second tail current to said second differential pair in response to said bias signal.

2. The system of claim 1, wherein said transistors are metal-oxide-semiconductor transistors.

3. A comparator system, comprising:
   first and second differential pairs of transistors that respectively provide first and second output signals in respective response to a first input signal and a reference signal and that have offset voltages which vary in correspondence to applied tail currents; and
   a feedback network configured to provide:
   a) a second tail current to said second differential pair sufficient to substantially null said second output signal; and
   b) a first tail current to said first differential pair that substantially equals said second tail current;
   said first output signal thereby providing a comparison of said first input signal to said reference signal;
   wherein said first and second differential pairs of transistors are configured to have substantially-equal, nonzero inherent offset voltages and wherein said feedback network includes:
   first and second current transistors arranged to have a common bias terminal and to respectively provide said first and second tail currents;
   first and second current mirrors that respectively mirror said first and second output signals into first and second mirror currents; and
   a third current mirror that mirrors said first mirror current into a third mirror current;
   wherein said second and third mirror currents meet at said bias terminal.

4. A comparator system, comprising:
   first and second differential pairs of transistors that respectively provide first and second output signals in respective response to a first input signal and a reference signal and that have offset voltages which vary in correspondence to applied tail currents; and
   a feedback network configured to provide:
   a) a second tail current to said second differential pair sufficient to substantially null said second output signal; and
   b) a first tail current to said first differential pair that substantially equals said second tail current;
   said first output signal thereby providing a comparison of said first input signal to said reference signal;
   wherein said first and second differential pairs of transistors are configured to have substantially-equal, nonzero inherent offset voltages and wherein, in each of said differential pairs, one of said transistors has a first channel width and the other of said transistors has a second channel width that differs from said first channel width to thereby generate said nonzero inherent offset voltages.

5. The A comparator system, comprising:
   first and second differential pairs of transistors that respectively provide first and second output signals in respective response to a first input signal and a reference signal and that have offset voltages which vary in correspondence to applied tail currents; and
   a feedback network configured to provide:
   a) a second tail current to said second differential pair sufficient to substantially null said second output signal; and
   b) a first tail current to said first differential pair that substantially equals said second tail current;
   said first output signal thereby providing a comparison of said first input signal to said reference signal;
   wherein said first and second differential pairs of transistors are configured to have substantially-zero inherent offset voltages and further including a first set of unequal loads coupled to said first differential pair; and wherein said feedback network includes:

a second set of unequal loads coupled to said second differential pair;

a differential amplifier that provides a bias signal in response to said second output signal; and a current transistor which provides said second tail current to said second differential pair in response to said bias signal.

6. A comparator system, comprising:

first and second differential pairs of transistors that respectively provide first and second output signals in respective response to a first input signal and a reference signal and that have offset voltages which vary in correspondence to applied tail currents; and a feedback network configured to provide:

a) a second tail current to said second differential pair sufficient to substantially null said second output signal; and b) a first tail current to said first differential pair that substantially equals said second tail current;

said first output signal thereby providing a comparison of said first input signal to said reference signal;

wherein said first and second differential pairs of transistors are configured to have substantially-zero inherent offset voltages and further including a first set of unequal current mirrors coupled to said first differential pair and wherein said feedback network includes:

first and second current transistors arranged to have a common bias terminal and to respectively provide said first and second tail currents;

a second set of unequal current mirrors coupled to said second differential pair with one of said second set coupled to said bias terminal; and a third current mirror coupled between the other of said second set and said bias terminal.

7. A comparator system, comprising:

first and second differential pairs of transistors that respectively provide first and second output signals in respective response to a first input signal and a reference signal and that have offset voltages which vary in correspondence to applied tail currents; and a feedback network configured to provide:

a) a second tail current to said second differential pair sufficient to substantially null said second output signal; and b) a first tail current to said first differential pair that substantially equals said second tail current;

said first output signal thereby providing a comparison of said first input signal to said reference signal;

wherein said first and second differential pairs of transistors are configured to have substantially-zero inherent offset voltages and further including:

a first set of substantially-equal loads coupled to said first differential pair;

a first current transistor which provides said first tail current in response to a bias signal; and a first offset transistor which provides a first offset current to one load of said first set in response to said bias signal;

and wherein said feedback network includes:

a second set of substantially-equal loads coupled to said second differential pair;

a second current transistor which provides said second tail current in response to a bias signal; and a second offset transistor which provides a second offset current to one load of said second set in response to said bias signal.

8. A comparator system, comprising:

first and second differential pairs of transistors that respectively provide first and second output signals in respective response to a first input signal and a reference signal and that have offset voltages which vary in correspondence to applied tail currents; and a feedback network configured to provide:

a) a second tail current to said second differential pair sufficient to substantially null said second output signal; and b) a first tail current to said first differential pair that substantially equals said second tail current;

said first output signal thereby providing a comparison of said first input signal to said reference signal and wherein said first and second differential pairs of transistors are configured to have substantially-zero inherent offset voltages and wherein, in each of said differential pairs, the transistors have substantially-equal channel widths to thereby generate said substantially-zero inherent offset voltages.

9. A converter system, comprising:

a plurality of converter stages serially connected to thereby convert an analog input signal to a corresponding digital output signal wherein at least one of said stages includes:

a comparator system that converts a respective portion of said input signal to at least one corresponding digital bit of said output signal; and a residue generator that provides another portion of said input signal to a subsequent one of said converter stages in the form of a residue signal which said generator generates in response to said respective portion and said corresponding digital bit;

and wherein said comparator system includes:

first and second differential pairs of transistors that respectively provide first and second output signals in respective response to a first input signal and a reference signal and that have offset voltages which vary in correspondence to applied tail currents; and a feedback network configured to provide a second tail current to said second differential pair sufficient to substantially null said second output signal and to provide a first tail current to said first differential pair that substantially equals said second tail current;

said first output signal thereby providing a comparison of said respective portion to said reference signal.

10. The system of claim 9, wherein said first and second differential pairs of transistors are configured to have substantially-equal, nonzero inherent offset voltages.

11. The system of claim 10, wherein, in each of said differential pairs, one of said transistors has a first channel width and the other of said transistors has a second channel width that differs from said first channel width to thereby generate said nonzero inherent offset voltages.

12. The system of claim 9, wherein said first and second differential pairs of transistors are configured to have substantially-zero inherent offset voltages.

13. The system of claim 12, wherein, in each of said differential pairs, the transistors have substantially-equal channel widths to thereby generate said substantially-zero inherent offset voltages.

14. The system of claim 9, wherein said feedback network includes first and second current sources that respectively provide said first and second tail currents.

15. The system of claim 9, wherein said transistors are metal-oxide-semiconductor transistors.

16. The system of claim 1, further including another current transistor which provides said first tail current to said first differential pair in response to said bias signal.

17. The system of claim 3, wherein said transistors are metal-oxide-semiconductor transistors.

18. The system of claim 4, wherein said transistors are metal-oxide-semiconductor transistors.

19. The system of claim 5, wherein said transistors are metal-oxide-semiconductor transistors.

20. The system of claim 6, wherein said transistors are metal-oxide-semiconductor transistors.

21. The system of claim 7, wherein said transistors are metal-oxide-semiconductor transistors.

22. The system of claim 8, wherein said transistors are metal-oxide-semiconductor transistors.

* * * * *

UNITED STATES PATENT AND TRADEMARK OFFICE
CERTIFICATE OF CORRECTION

PATENT NO. : 6,970,124 B1
DATED : November 29, 2005
INVENTOR(S) : Gregory Wayne Patterson It is certified that error appears in the above-identified patent and that said Letters Patent is hereby corrected as shown below:

Column 8,
Line 8, delete "Sin" and insert -- $S_{in}$ --.

Column 10,
Line 49, delete "The".

Signed and Sealed this

Twenty-eighth Day of March, 2006

JON W. DUDAS
*Director of the United States Patent and Trademark Office*